United States Patent
Schultheis et al.

(10) Patent No.: US 11,248,941 B2
(45) Date of Patent: Feb. 15, 2022

(54) METHOD FOR MANUFACTURING A SENSOR OF A THERMAL, FLOW MEASURING DEVICE FOR MEASURING MASS FLOW OF A MEDIUM IN A MEASURING TUBE

(71) Applicant: Endress+Hauser Flowtec AG, Reinach (CH)

(72) Inventors: Hanno Schultheis, Hermrigen (CH); Alexander Grün, Lörrach (DE); Stephan Gaberthüel, Oberwil (CH)

(73) Assignee: Endress+Hauser Flowtec AG, Reinach (CH)

( * ) Notice: Subject to any disclaimer, the term of this patent is extended or adjusted under 35 U.S.C. 154(b) by 275 days.

(21) Appl. No.: 16/315,735

(22) PCT Filed: Jun. 26, 2017

(86) PCT No.: PCT/EP2017/065644
§ 371 (c)(1),
(2) Date: Jan. 7, 2019

(87) PCT Pub. No.: WO2018/007181
PCT Pub. Date: Jan. 11, 2018

(65) Prior Publication Data
US 2019/0301907 A1    Oct. 3, 2019

(30) Foreign Application Priority Data
Jul. 7, 2016    (DE) .................... 10 2016 112 496.6

(51) Int. Cl.
*B22F 3/22*    (2006.01)
*B22F 7/06*    (2006.01)
(Continued)

(52) U.S. Cl.
CPC ................ *G01F 1/69* (2013.01); *B22F 3/225* (2013.01); *B22F 7/06* (2013.01); *B22F 7/08* (2013.01);
(Continued)

(58) Field of Classification Search
CPC ........ G01F 1/8404; G01F 1/684; G01F 15/14; G01R 3/00; B22F 3/225; B22F 7/06; H01C 3/00
See application file for complete search history.

(56) References Cited

U.S. PATENT DOCUMENTS 3,232,794 A    2/1966    Korton
4,778,537 A * 10/1988    Thom ...................... G01K 7/04
                                                  136/201
(Continued)

FOREIGN PATENT DOCUMENTS

DE    102007042789 A1    3/2009
DE    102009028848 A1    3/2011
(Continued)

OTHER PUBLICATIONS

Search Report for German Patent Application No. 10 2016 112 496.6, German Patent Office, dated Feb. 24, 2017, 6 pp.
(Continued)

*Primary Examiner* — Peter Dungba Vo
*Assistant Examiner* — Jose K Abraham
(74) *Attorney, Agent, or Firm* — Christopher R. Powers; Endress+Hauser (USA) Holding Inc.

(57) ABSTRACT

The present disclosure relates to a method for manufacturing a sensor for a thermal, flow measuring device. The method includes, in such case, manufacturing a metal jacketing for a sensor core, introducing the sensor core into the metal jacketing and sintering the metal jacketing with introduced sensor core.

6 Claims, 3 Drawing Sheets

(51) Int. Cl.
*G01F 1/684* (2006.01)
*G01F 15/14* (2006.01)
*H01C 3/00* (2006.01)
*B22F 7/08* (2006.01)
*G01F 1/84* (2006.01)
*G01R 3/00* (2006.01)
*H01C 1/036* (2006.01)
*G01F 1/69* (2006.01)

(52) U.S. Cl.
CPC ............ *G01F 1/684* (2013.01); *G01F 1/8404* (2013.01); *G01F 15/14* (2013.01); *G01R 3/00* (2013.01); *H01C 3/00* (2013.01); *B22F 2998/10* (2013.01); *H01C 1/036* (2013.01)

(56) References Cited

U.S. PATENT DOCUMENTS

| | | | | |
|---|---|---|---|---|
| 5,880,365 | A * | 3/1999 | Olin | .......... G01F 1/684 73/204.25 |
| 7,997,795 | B2 * | 8/2011 | Schwagerman | ......... G01K 1/08 374/179 |
| 2003/0202897 | A1 * | 10/2003 | Clark | .......... B22F 5/10 419/6 |
| 2009/0260431 | A1 | 10/2009 | Olin et al. | |
| 2010/0284437 | A1 | 11/2010 | Stoll et al. | |
| 2018/0172535 | A1 * | 6/2018 | Harsh | .......... G01K 13/02 |

FOREIGN PATENT DOCUMENTS

| | | |
|---|---|---|
| DE | 102010063062 A1 | 6/2012 |
| DE | 202015106200 U1 | 12/2015 |
| GB | 1440393 A1 | 6/1976 |
| JP | S58158531 A | 9/1983 |
| JP | H10332495 A | 12/1998 |
| WO | 2011102810 A1 | 8/2011 |
| WO | WO-2014046675 A1 * 3/2014 ............ G01F 1/684 |
| WO | 2015140182 A1 | 9/2015 |

OTHER PUBLICATIONS

Bulger, Matt, Metal injection molding, Advanced Materials & Processes, Mar. 2005, pp. 39-40.
International Search Report for Patent Application No. PCT/EP2017/065644, WIPO, dated Oct. 5, 2017, 14 pp.

* cited by examiner

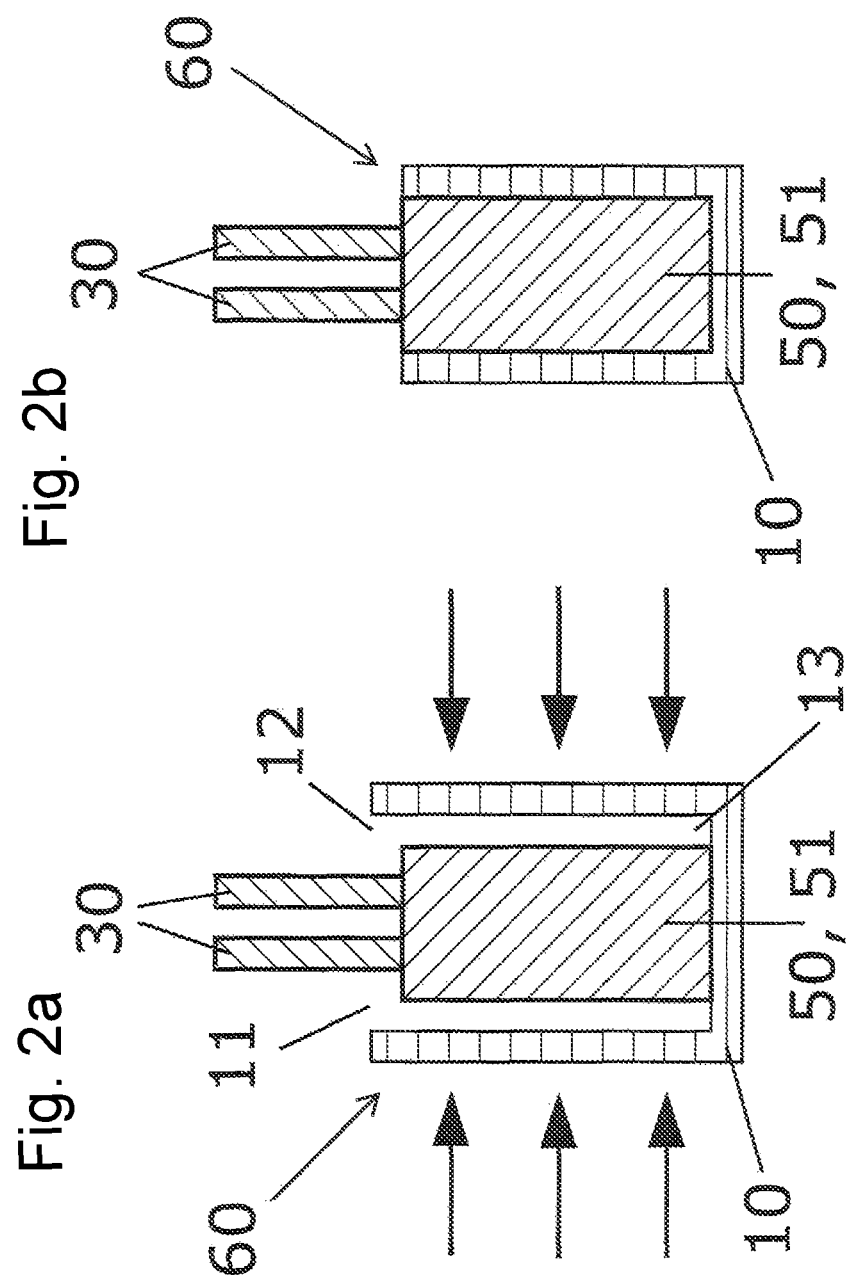

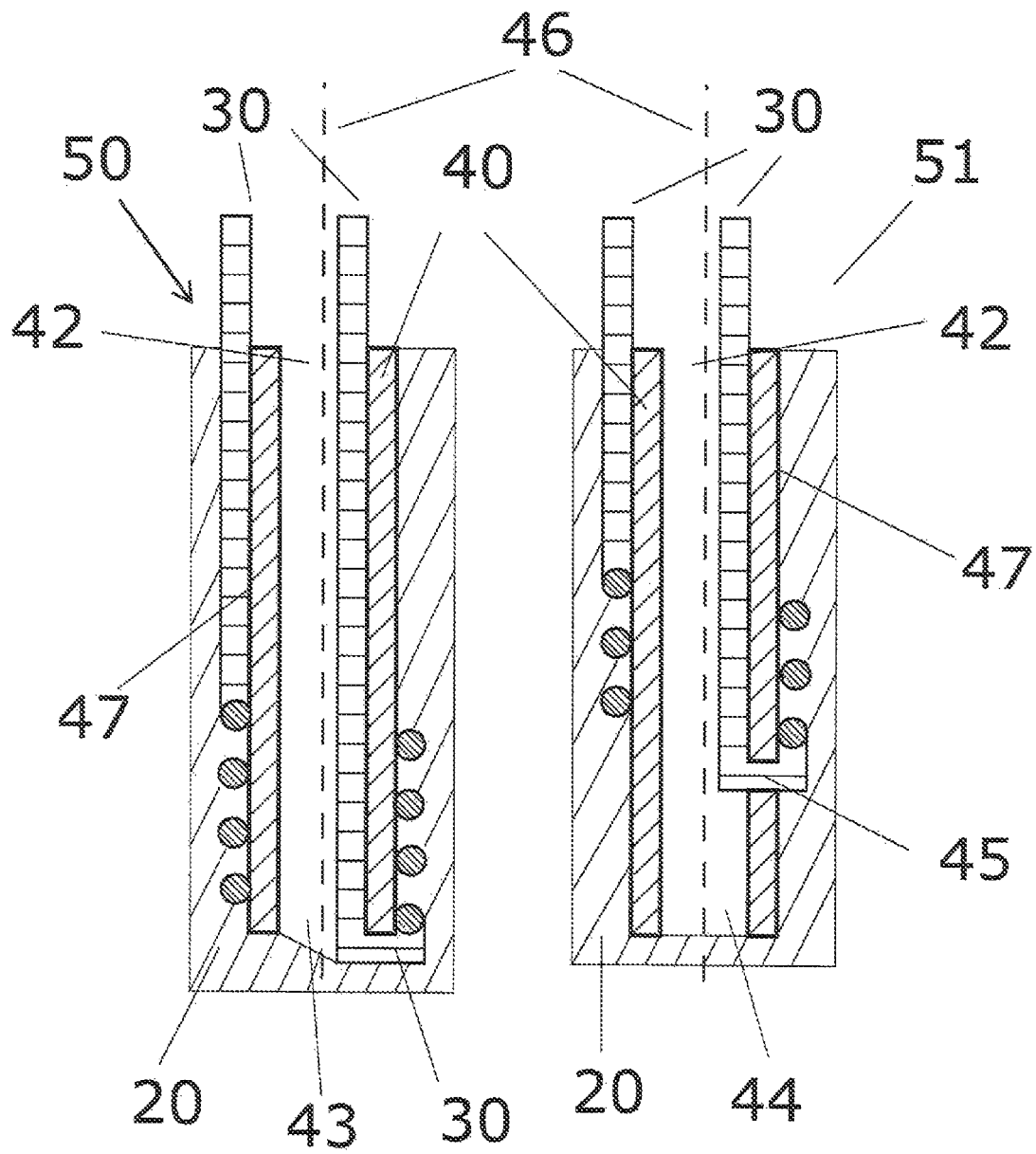

ered downstream by one or more passive sensor elements; see, for example, disclosure document DE102009028848A1.
METHOD FOR MANUFACTURING A SENSOR OF A THERMAL, FLOW MEASURING DEVICE FOR MEASURING MASS FLOW OF A MEDIUM IN A MEASURING TUBE

CROSS-REFERENCE TO RELATED APPLICATIONS

The present application is related to and claims the priority benefit of German Patent Application No. 10 2016 112 496.6, filed on Jul. 7, 2016 and International Patent Application No. PCT/EP2017/065644 filed on Jun. 26, 2017, the entire contents of which are incorporated herein by reference.

TECHNICAL FIELD

The invention relates to a method for manufacturing a sensor of a thermal, flow measuring device and to a sensor.

BACKGROUND

Thermal sensors for measuring mass flow are of essentially two different types. In one case, a temperature difference is kept constant between two sensors in a mass flow. In a second case, one or more active sensor elements inject an amount of heat into a mass flow, which amount of heat is registered downstream by one or more passive sensor elements; see, for example, disclosure document DE102009028848A1.

Sensors usually have a metal shell, which is in contact with the medium flowing through the measuring tube. The metal shell has a sensor element in its interior, wherein for the temperature measurement frequently the measuring of a temperature dependent resistance is relied on.

The state of the art includes sensors, in the case of which a sensor core is inserted into a shell, wherein the shell has a slightly greater inner diameter than the outer diameter of the sensor core. As a result, there are problems for establishing a sufficiently good thermal contact between the metal shell and the sensor core, whereby use of a potting compound is necessary.

A possibility for avoiding use of a potting compound involves pressing the metal sleeve against the sensor core using a high external pressure. In this way, a sufficiently good thermal contact can be manufactured. For example, disclosure document U.S. Pat. No. 5,880,365A discloses a sensor, in the case of which a metal shell is pressed onto a sensor core by hydroforming. However, there is in the case of this manufacturing method the danger that the compression forms non-uniformly during the pressing procedure and, thus, the sensor element is damaged due to non-uniform mechanical loading.

SUMMARY

An object of the invention, consequently, is a method for manufacturing a sensor of a thermal, flow measuring device and a sensor, in the case of which use of a potting compound can be omitted and the risk of damage during the manufacturing is minimized.

The object of the invention is achieved by a method as defined in independent claim 1 and by a sensor as defined in independent claim 8.

The method of the invention for manufacturing a sensor includes, in such case, method steps as follows:

manufacturing a metal jacketing by means of a metal powder injection molding method, wherein the jacketing has at least a first blind hole, whereby a first end of the jacketing is open, and whereby a second end of the jacketing is closed;

introducing a sensor core into the first blind hole of the metal jacketing through the first end, wherein the jacketing completely encloses the sensor core;

sintering the metal jacketing, wherein the sensor core includes:

at least one ceramic core, which has at least one lateral surface; and at least one metal wire, which is wound around the lateral surface of the ceramic core;

and at least one electrically insulating layer adapted to insulate the metal wire electrically from the metal jacketing.

In an embodiment of the method, the jacketing shrinks during the sintering, wherein the cross section of the first blind hole before sintering of the jacketing is greater than the cross section of the sensor core, and wherein after sintering of the jacketing the cross section of the first blind hole equals the cross section of the sensor core, and wherein the jacketing after the sintering completely encloses the sensor core and establishes a thermal contact to the sensor core.

In an embodiment of the method, after sintering, a releasing of the sensor core from the jacketing requires a tensile force of at least 1 Newton and especially at least 10 N and preferably at least 100 N.

In an embodiment of the method, for manufacture of the jacketing by means of a metal powder injection molding method, the metal powder has a grain size less than 6 micrometers, and especially less than 4 micrometers and preferably less than 2 micrometers. Grain size has a strong influence on the strength of the sintered metal jacketing and on how impermeable it is. Thus, the smaller the grain size, the better the impermeability and the greater the cohesion between individual grains of the metal jacketing. It has been found that from a grain size of 6 micrometers and less, a sufficient impermeability and stability of the metal jacketing is obtained.

In an embodiment of the method, the volume of the jacketing decreases by less than 40% and especially less than 30% and preferably less than 20% from the sintering after insertion of the sensor core.

In an embodiment of the method, the ceramic core has a hollow-cylindrical structure with an open third end and an open fourth end, wherein the metal wire is led through the fourth end to the third end, and wherein the third end of the ceramic core faces toward the open first end of the jacketing and wherein the fourth end of the ceramic core faces toward the closed second end of the jacketing.

In an embodiment of the method, the ceramic core has a hollow-cylindrical structure having a second blind hole and an open third end and a fifth end, wherein the ceramic core has, furthermore, in the region of the fifth end a radial bore for the second blind hole, wherein the metal wire is led through the radial bore to the third end, and wherein the third end of the ceramic core faces toward the open first end of the jacketing and wherein the fifth end of the ceramic core faces toward the closed second end of the jacketing. The fifth end can, in such case, be open or closed.

A sensor of the invention for measuring mass flow of a medium in a measuring tube by means of a thermal flow measuring device includes, in such case:

at least one metal jacketing, wherein the jacketing has at least a first blind hole, whereby a first end of the jacketing is open, and whereby a second end of the jacketing is closed; and at least one sensor core having at least one ceramic core, which has at least one lateral surface, and having at least one metal wire, which is wound around the lateral surface of the ceramic core;

wherein the sensor core is located in the first blind hole, such that the jacketing completely encloses the sensor core;

wherein the sensor core has at least one electrically insulating layer adapted to insulate the metal wire electrically from the metal jacketing.

In an embodiment of the sensor, the winding has at least 10 and especially at least 30 and preferably at least 50 turns. Ideally, the wire is closely wound in the region of the winding, so that a resistance concentration is present in a small region of the sensor core. At least in the region of the winding, the wire can have an insulating covering, so that in the region of the winding the turns can laterally contact one another, without short circuiting between the turns.

In an embodiment of the sensor, the electrically insulating layer is a ceramic powder or a ceramic paste.

In an embodiment of the sensor, the ceramic core is a hollow cylinder and includes an open third end and an open fourth end, wherein the metal wire is led through the fourth end to the third end, and wherein the third end of the ceramic core faces toward the open first end of the jacketing and wherein the fourth end of the ceramic core faces toward the closed second end of the jacketing.

In an embodiment of the sensor, the ceramic core has a hollow-cylindrical structure having a second blind hole and an open third end and a fifth end, wherein the ceramic core, furthermore, in the region of the fifth end has a radial bore for the second blind hole, wherein the metal wire is led through the radial bore to the third end, and wherein the third end of the ceramic core faces toward the open first end of the jacketing and wherein the fifth end of the ceramic core faces toward the closed second end of the jacketing. The fifth end can, in such case, be open or closed.

In an embodiment of the sensor, the wire is manufactured of a metal or an alloy having a melting temperature greater than 1300° C. and especially greater than 1500° C. and preferably greater than 1800° C., such as, for example, platinum or tungsten or tantalum.

In an embodiment of the sensor, the diameter of the wire in the region of the winding is less than 0.3 mm and especially less than 0.1 mm and preferably less than 0.05 mm. A wire diameter reduced in size in the region of the winding can increase the resistance in the region of the winding in comparison with the rest of the wire, such that a greater resistance concentration in the region of the winding is achieved.

In an embodiment of the sensor, the outer diameter of the ceramic core is less than 5 mm and especially less than 4 mm and preferably less than 2.5 mm.

In an embodiment of the sensor, the ceramic core has a longitudinal axis, wherein the length of the ceramic core along the longitudinal axis is at least 3 mm and preferably at least 5 mm and especially at least 10 mm and at most 100 mm and especially at most 60 mm and preferably at most 30 mm.

In an embodiment of the sensor, the winding is arranged in the region of the fourth end and has along the longitudinal axis a length of at most 7 mm and preferably at most 5 mm and especially at most 3 mm. By using a small length for the winding region, the temperature of the medium can be determined for a small region.

In an embodiment of the sensor, the wall thickness of the jacketing is at least 0.05 mm and especially at least 0.1 mm and preferably at least 0.15 mm and at most 1 mm and especially at most 0.6 mm and preferably at most 0.3 mm.

Thus, the present invention provides a method for manufacturing a sensor of a thermal, flow measuring device for measuring mass flow of a medium in a measuring tube and a sensor of a thermal, flow measuring device.

BRIEF DESCRIPTION OF THE DRAWING

In the following, the invention will now be explained based on examples of embodiments and the appended drawing, the figures of which show as follows:

FIG. 2 shows a schematic cross section of a metal jacketing of the invention with sensor core before and after sintering.

FIG. 3a shows a schematic cross section of a sensor core of the invention according to a first form of embodiment.

FIG. 3b shows a schematic cross section of a sensor core of the invention according to a second form of embodiment.

DETAILED DESCRIPTION

Figure 1:
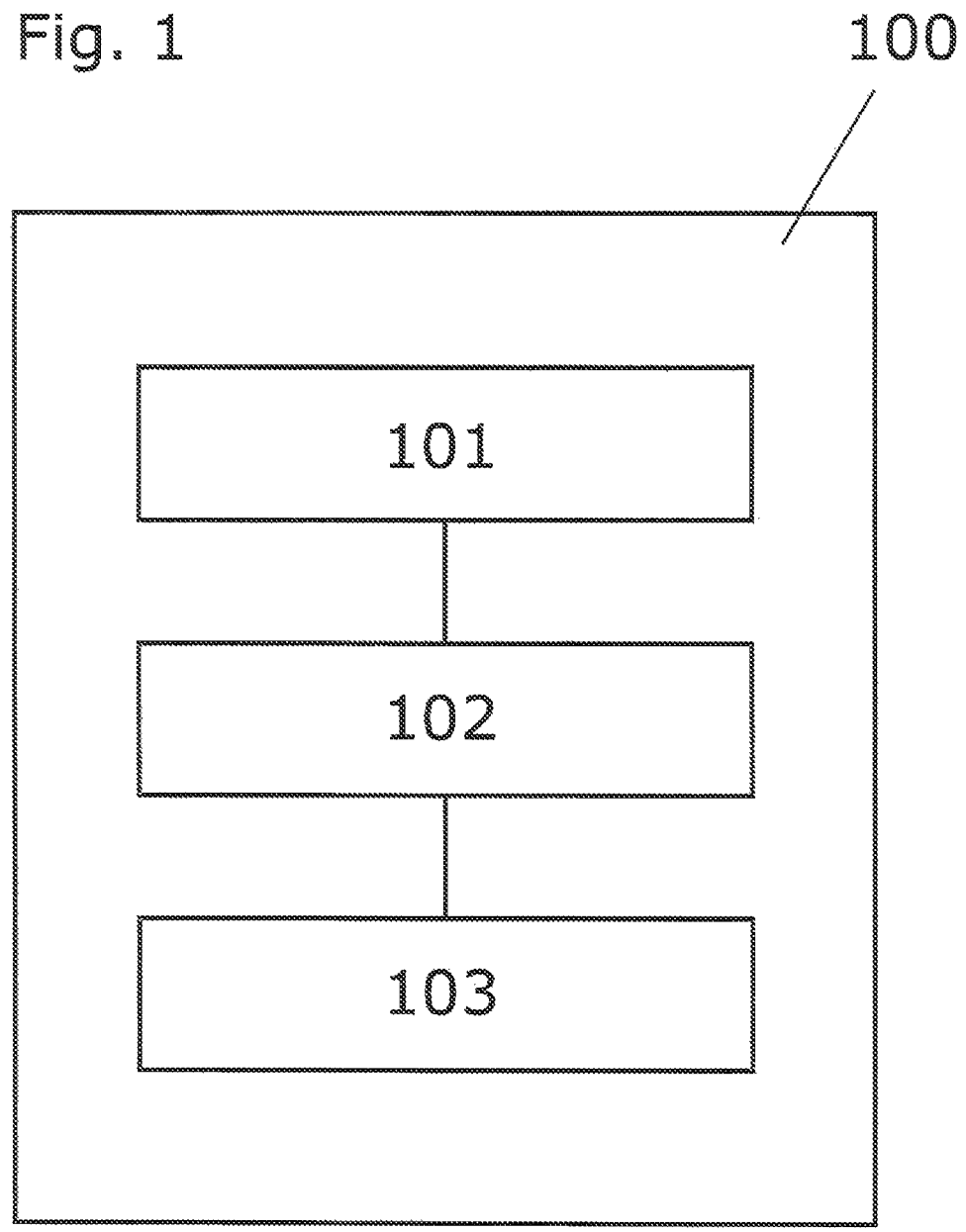
FIG. 1 shows a schematic process flow diagram for manufacturing a temperature sensor of the invention.

FIG. 1 shows a form of embodiment of the process flow 100 for manufacturing a temperature sensor of the invention. In a first step 101, in such case, a metal jacketing 10 for a sensor core 50, 51 of a sensor 60 for a thermal, flow measuring device is manufactured by means of a metal powder injection molding method. In a second step 102, the sensor core 50, 51 is introduced into the metal jacketing 10. By sintering the metal jacketing 10 in a third step 103 with introduced sensor core 50, 51, the metal jacketing 10 shrinks until it tightly holds the sensor core 50, 51 and assures a good thermal contact. The sensor core can, in such case, only be released from the metal jacketing 10 by tensile forces of at least 1 N.

FIG. 2 shows a form of embodiment of the sensor 60 before and after sintering. FIG. 2a shows the sensor 60 before the sintering, wherein the metal jacketing 10 completely encloses but does not grasp the sensor core 50, 51. A wire 30 is, in such case, led through an open first end 12 of the metal jacketing 10, which forms a blind hole 11, and to an operating electronics, which is adapted to operate the sensor 60. Ideally, the sensor core 50, 51 is in contact with a closed second end 13 of the metal jacketing 10 at the beginning of the sintering. The sintering shrinks the metal jacketing 10, until the inner diameter of the metal jacketing assumes the size of the outer diameter of the sensor core 60; see FIG. 2b.

FIG. 3 shows schematically two forms of embodiment of the sensor core 50, 51 for the invention. FIG. 3a shows a sensor core 50 having a ceramic core 40 having a lateral surface 47. Ceramic core 40 has a hollow-cylindrical structure with an open third end 42 and with an open fourth end 43, wherein the metal wire 30 is led from the lateral surface 47 through the fourth end 43 to the third end 42. FIG. 3b shows a sensor core 51, whose ceramic core 40 in contrast to the form of embodiment shown in FIG. 3a has in the region of the fifth end 44 a radial bore 45, through which the wire 30 is led from the lateral surface to the open third end 42. The fifth end 44 can, in such case, be, instead, a closed end. The winding of the wire 30 around the lateral surface 47 of the ceramic core 50, 51 is concentrated, in such case, in both forms of embodiment in a limited region, in order to bring about a resistance concentration within the region. The sensor 60 can be operated in a number of ways. On the one hand, it can be used for heating a medium flowing around it. On the other hand, it can be used for measuring the temperature of the medium and/or of the sensor. In all cases, a resistance concentration to a limited region is advantageous. Sensor core 50, 51 includes an electrically insulating layer 20, which electrically insulates the wire 30 from the metal jacketing 10, wherein the electrically insulating layer 20 is a ceramic powder or a ceramic paste.

The invention claimed is:

1. A method for manufacturing a sensor of a thermal, flow measuring device for measuring mass flow of a medium in a measuring tube, the method comprising:
   manufacturing a metal jacketing using a metal powder injection molding method, wherein the jacketing has a first blind hole, an open first end, and a closed second end;
   introducing a sensor core into the first blind hole of the jacketing through the open first end, wherein the jacketing completely encloses the sensor core; and
   sintering the jacketing such that, after sintering, a releasing of the sensor core from the jacketing requires a tensile force of at least 1 Newton,
   wherein the sensor core includes:
      a ceramic core having a lateral surface;
      a metal wire wound around the lateral surface of the ceramic core; and
      an electrically insulating layer adapted to insulate the metal wire electrically from the jacketing.

2. The method as claimed in claim 1, wherein the jacketing shrinks during the sintering, wherein a cross section of the first blind hole before sintering of the jacketing is greater than a cross section of the sensor core, wherein after sintering of the jacketing the cross section of the first blind hole equals the cross section of the sensor core, and wherein the jacketing after sintering of completely encloses the sensor core and establishes a thermal contact with the sensor core.

3. The method as claimed in claim 1, wherein the metal powder injection molding method uses a metal powder having a grain size less than 6 micrometers.

4. The method as claimed in claim 2, wherein the volume of the jacketing decreases by less than 40% from the sintering after insertion of the sensor core.

5. The method as claimed in claim 1, wherein the ceramic core has a hollow-cylindrical structure having an open third end and an open fourth end, wherein the metal wire is led through the fourth end to the third end, and
   wherein the third end of the ceramic core faces toward the open first end of the jacketing and the fourth end of the ceramic core faces toward the closed second end of the jacketing.

6. The method as claimed in claim 1, wherein the ceramic core has a hollow-cylindrical structure having an open third end and a fifth end, wherein the ceramic core has in the region of the fifth end a radial bore, wherein the metal wire is led through the radial bore to the third end, and
   wherein the third end of the ceramic core faces toward the open first end of the jacketing and the fifth end of the ceramic core faces toward the closed second end of the jacketing.

* * * * *